(12) United States Patent
Li

(10) Patent No.: US 10,363,689 B2
(45) Date of Patent: Jul. 30, 2019

(54) METHOD OF MANUFACTURING FLUORESCENT SILICONE FILM

(71) Applicant: Feng Li, Guangdong (CN)

(72) Inventor: Feng Li, Guangdong (CN)

(*) Notice: Subject to any disclaimer, the term of this patent is extended or adjusted under 35 U.S.C. 154(b) by 0 days.

(21) Appl. No.: 15/310,764

(22) PCT Filed: May 18, 2015

(86) PCT No.: PCT/CN2015/000336
§ 371 (c)(1),
(2) Date: Nov. 13, 2016

(87) PCT Pub. No.: WO2016/179723
PCT Pub. Date: Nov. 17, 2016

(65) Prior Publication Data
US 2018/0117800 A1    May 3, 2018

(30) Foreign Application Priority Data
May 8, 2015  (CN) .......................... 2015 1 0233780

(51) Int. Cl.
*B29C 41/22*   (2006.01)
*B29C 41/04*   (2006.01)
*H01L 33/50*   (2010.01)
*F21K 9/64*    (2016.01)
*F21Y 115/10*  (2016.01)
*B29K 83/00*   (2006.01)
*B29L 31/34*   (2006.01)
*F21V 9/30*    (2018.01)

(52) U.S. Cl.
CPC .............. *B29C 41/22* (2013.01); *B29C 41/04* (2013.01); *H01L 33/505* (2013.01); *B29K 2083/00* (2013.01); *B29K 2995/0035* (2013.01); *B29L 2031/3406* (2013.01); *F21K 9/64* (2016.08); *F21V 9/30* (2018.02); *F21Y 2115/10* (2016.08); *H01L 33/508* (2013.01); *H01L 2933/0041* (2013.01)

(58) Field of Classification Search
CPC ..................................................... B29C 65/528
See application file for complete search history.

(56) References Cited

U.S. PATENT DOCUMENTS

| | | | | |
|---|---|---|---|---|
| 2002/0076577 A1* | 6/2002 | Noguchi | ............... | C08G 61/02 428/690 |
| 2003/0128812 A1* | 7/2003 | Appleby | ............. | B29C 33/3842 378/147 |
| 2010/0221550 A1* | 9/2010 | Lin | ...................... | C09K 11/574 428/413 |

* cited by examiner

*Primary Examiner* — Monica A Huson
*Assistant Examiner* — Kelsey C Grace

(57) ABSTRACT

A method of manufacturing a fluorescent silicone film contains: steps of: A. mixing optical silicone and fluorescent powders so as to produce a mixture, and adding liquid to the mixture; B. vacuuming, degassing and feeding the mixture into an accommodation cavity of a mold; C. placing the mold into a planetary centrifugal mixer so as to centrifuge the mixture; D. forming the fluorescent silicone film in the accommodation cavity; and E. solidifying and removing the fluorescent silicone film from the mold. In the step of A, the optical silicone and the fluorescent powders are mixed at a ratio of 100:10 to 100:25. In the step of B, the accommodation cavity is closed after feeding the mixture. In the step of D, the fluorescent silicone film has a silicone layer and a fluorescent powder layer which are formed in the accommodation cavity in a chemical vapor deposition (CVD) manner.

7 Claims, 4 Drawing Sheets

METHOD OF MANUFACTURING FLUORESCENT SILICONE FILM

FIELD OF THE INVENTION

The present invention relates to a method of manufacturing fluorescent silicone film which has the light emitting layer made of the fluorescent powders and has the light transmission layer made of the optical silicone.

BACKGROUND OF THE INVENTION

A conventional LED chip is packaged by way of an optical lens and fluorescent powders. An LED lamp, which emits white light or other light (such as red light, yellow light, green light, blue light, and purple light), is made of fluorescent powders so as to enhance luminous efficiency of the LED lamp.

The fluorescent powders are printed and sprayed on the LED lamp, but the silicone cannot be integrally formed with the fluorescent powders, so a light refraction produces to cause light loss.

The present invention has arisen to mitigate and/or obviate the afore-described disadvantages.

SUMMARY OF THE INVENTION

The primary objective of the present invention is to provide a method of manufacturing fluorescent silicone film which has the light emitting layer made of the fluorescent powders and has the light transmission layer made of the optical silicone.

To obtain above-mentioned objective, a method of manufacturing fluorescent silicone film provided by the present invention contains steps of:

A. mixing optical silicone and fluorescent powders so as to produce a mixture of the optical silicone and the fluorescent powders, and then adding liquid to the mixture;

B. vacuuming and degassing the mixture to which the liquid is added, and feeding the mixture into an accommodation cavity of a mold;

C. placing the mold into a planetary centrifugal mixer so as to centrifuge the mixture in the accommodation cavity of the mold;

D. forming a fluorescent silicone film in the accommodation cavity; and

E. solidifying and removing the fluorescent silicone film from the mold.

In the step of A, the optical silicone and the fluorescent powders are mixed at a ratio of 100:10 to 100:25.

In the step of B, the accommodation cavity is closed after feeding the mixture.

In the step of D, the fluorescent silicone film has a silicone layer and a fluorescent powder layer which are formed in the accommodation cavity in a chemical vapor deposition (CVD) manner.

In the step of E, the mold is baked and is cooled, wherein the mold is fixed in a baking machine so as to be baked in a temperature of 70° C. for 45-90 minutes by the baking machine, and the mold is cooled in a room temperature so as to solidify the fluorescent silicone film in the accommodation cavity of the mold, thereafter the fluorescent silicone film is removed from the mold.

The mold includes a base and a lid, and the base has an accommodation cavity configured to accommodate the mixture.

The accommodation cavity has a flat slot and a plurality of trapezoid trenches communicating with the flat slot.

Preferably, a positioning structure is defined on the base and the lid, and the positioning structure includes at least one fixing column extending upwardly from a top of the base, and the positioning structure also includes at least one connection orifice defined on the lid and configured to fit with the at least one fixing column.

In another embodiment, a method of manufacturing a fluorescent silicone film contains steps of:

A. mixing optical silicone and fluorescent powders so as to produce a mixture of the optical silicone and the fluorescent powders, adding liquid to the mixture, and feeding the mixture into an accommodation cavity of a mold;

B. placing the mold into a planetary centrifugal mixer so as to centrifuge the mixture in the accommodation cavity of the mold;

C. forming a fluorescent silicone film in the accommodation cavity; and

D. solidifying and removing the fluorescent silicone film from the mold.

In the step of C, the fluorescent silicone film has a silicone layer and a fluorescent powder layer which are formed in the accommodation cavity in a chemical vapor deposition (CVD) manner.

The mold includes a base and a lid, and the base has the accommodation cavity configured to accommodate the mixture.

The accommodation cavity of the base has a flat slot and a plurality of trapezoid trenches communicating with the flat slot.

The fluorescent powder layer floats in the flat slot of the accommodation cavity, and the silicone layer is located under the fluorescent powder layer in the accommodation cavity.

Preferably, the fluorescent silicone film includes a light transmission layer and a light emitting layer, wherein the light emitting layer is made of the fluorescent powders, and the light transmission layer is made of the optical silicone and has multiple trapezoid protrusions arranged on a bottom thereof.

BRIEF DESCRIPTION OF THE DRAWINGS

FIG. 3-1 is an amplified side plane view showing the assembly of a portion A of the fluorescent silicone film according to the first embodiment of the present invention.

FIG. 4-1 is an amplified side plane view showing the assembly of a portion A of the fluorescent silicone film according to the first embodiment of the present invention.

DETAILED DESCRIPTION OF THE PREFERRED EMBODIMENTS

A method of manufacturing a fluorescent silicone film according to a first embodiment of the present invention comprises steps:

A. mixing optical silicone and fluorescent powders at a ratio of 100:10 to 100:25 so as to produce a mixture of the optical silicone and the fluorescent powders, and then liquid (such as water) is added to the mixture;

B. vacuuming and degassing the mixture to which the liquid is added, wherein the mixture is fed into an accommodation cavity of a mold after vacuuming and degassing the mixture, and the accommodation cavity is closed after feeding the mixture;

C. placing the mold into a planetary centrifugal mixer so as to centrifuge the mixture in the accommodation cavity;

D. forming the fluorescent silicone film in the accommodation cavity, wherein the fluorescent silicone film has a silicone layer and a fluorescent powder layer which are formed in the accommodation cavity in a chemical vapor deposition (CVD) manner; and E. solidifying and removing the fluorescent silicone film from the mold, wherein the mold is baked and is cooled, for example, the mold is fixed in a baking machine so as to be baked in a temperature of 70° C. for 45-90 minutes by the baking machine, and the mold is cooled in a room temperature so as to solidify the fluorescent silicone film in the accommodation cavity of the mold, thereafter the fluorescent silicone film is removed from the mold.

Figure 1:
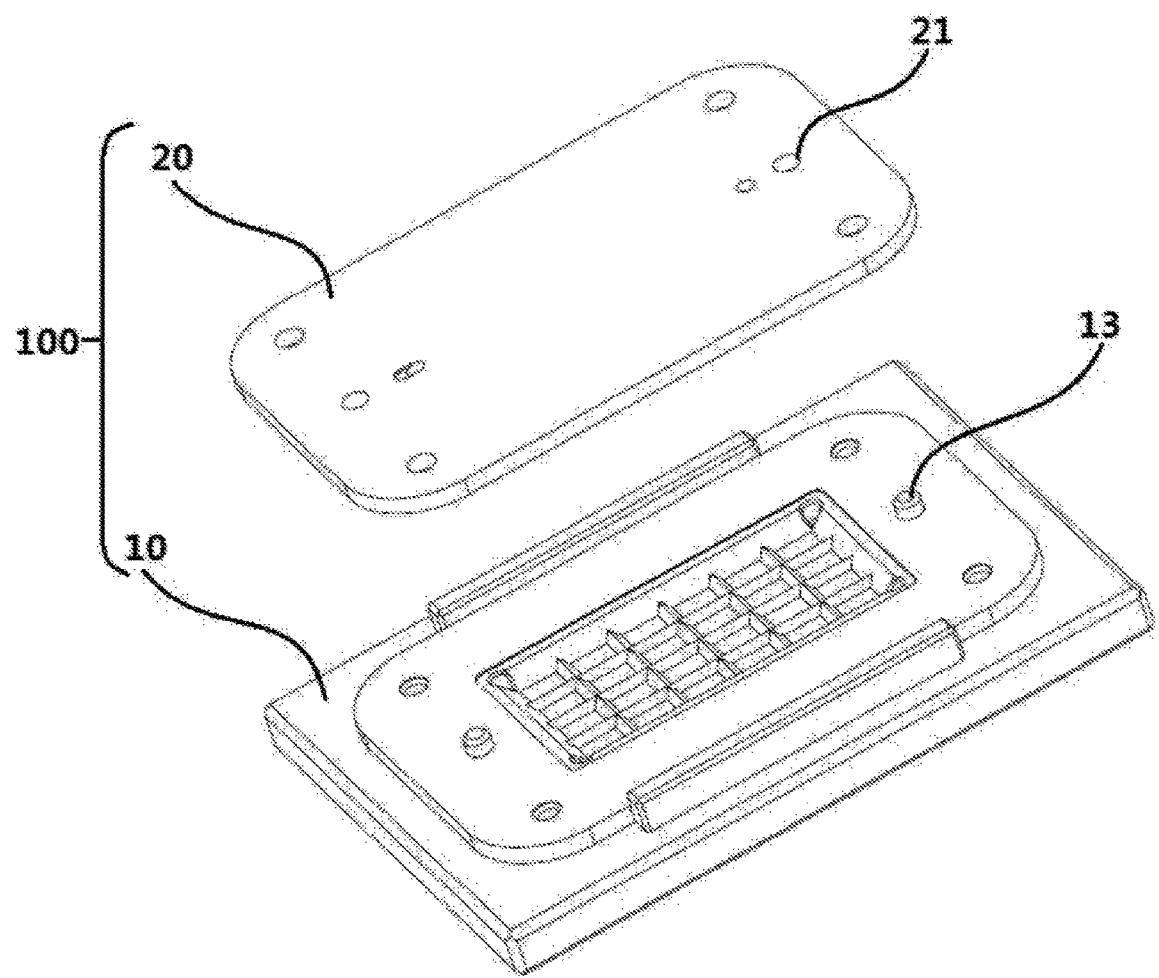
FIG. 1 is a perspective view showing the exploded components of a mold according to a first embodiment of the present invention.

With reference to FIG. 1, the mold 100 includes a base 10 and a lid 20, wherein the base 10 has an accommodation cavity configured to accommodate manufacturing materials (such as the mixture to which the liquid is added).

Figure 2:
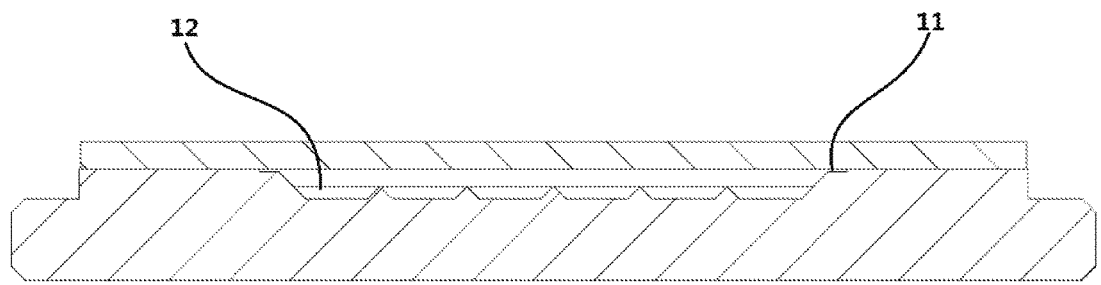
FIG. 2 is a cross sectional view showing the assembly of the mold according to the first embodiment of the present invention.

Referring to FIG. 2, the accommodation cavity has a flat slot 11 and a plurality of trapezoid trenches 12 communicating with the flat slot 11.

Furthermore, a positioning structure is defined on the base 10 and the lid 20, and the positioning structure includes at least one fixing column 13 extending upwardly from a top of the base 10, and the positioning structure also includes at least one connection orifice 21 defined on the lid 20 and configured to fit with the at least one fixing column 13.

After the optical silicone the fluorescent powders are mixed to produce the mixture and the liquid is added to the mixture, the mixture is fed into the accommodation cavity of the mold, wherein the mold includes the base and the lid, and the base has the accommodation cavity configured to accommodate the mixture. The accommodation cavity has the flat slot 11 and the plurality of trapezoid trenches 12 communicating with the flat slot 11.

The mixture in the accommodation cavity of the mold is centrifuged by the planetary centrifugal mixer so as to form the fluorescent silicone film, and the fluorescent silicone film has the silicone layer and the fluorescent powder layer which are formed in the accommodation cavity in the CVD manner, wherein the fluorescent powder layer floats in the flat slot of the accommodation cavity, and the silicone layer is located under the fluorescent powder layer in the accommodation cavity. Thereafter, the fluorescent silicone film is solidified and is removed from the mold.

Figure 3:
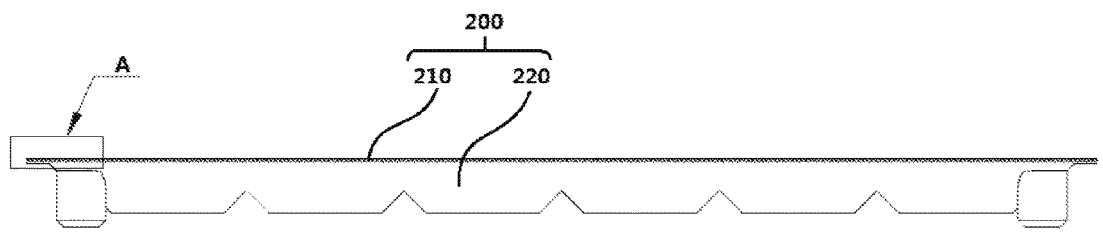
FIG. 3 is a side plane view showing the assembly of a fluorescent silicone film according to the first embodiment of the present invention.
Figures 1, 3:
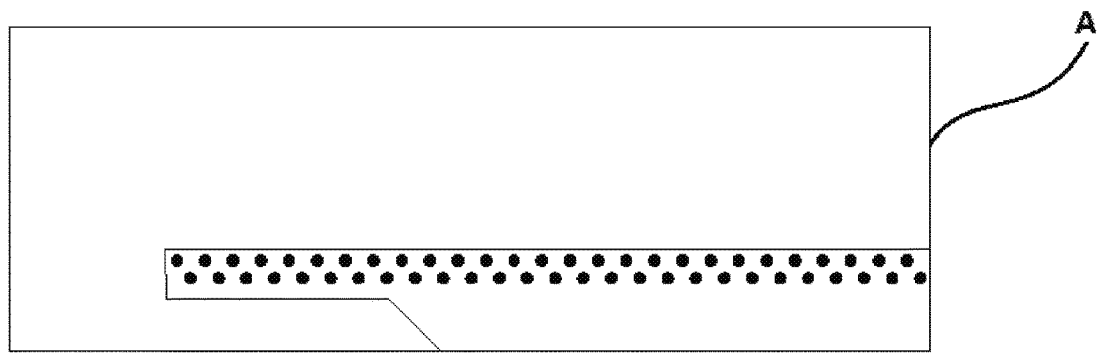

As shown in FIGS. 3 and 3-1, the fluorescent silicone film 200 is manufactured by the mold, wherein the fluorescent silicone film 200 includes a light transmission layer 210 and a light emitting layer 220, wherein the light emitting layer 220 is made of the fluorescent powders, the light transmission layer 210 is made of the optical silicone and has multiple trapezoid protrusions arranged on a bottom thereof.

Figure 4:
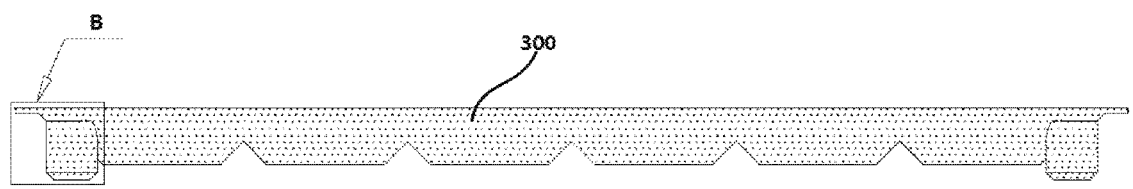
FIG. 4 is a side plane view showing the assembly of a fluorescent silicone film according to a second embodiment of the present invention.
Figures 1, 4:
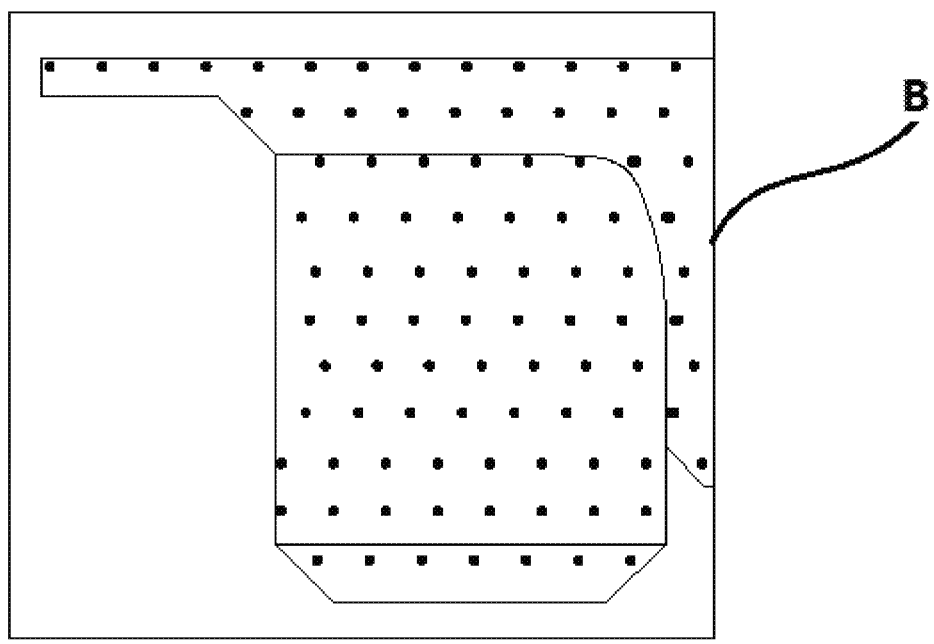

As illustrated in FIG. 4, in a second embodiment, the fluorescent silicone film 300 is made of the fluorescent powders and the optical silicone, wherein the fluorescent powders irregularly spread in the silicone fluorescent film 300.

Thereby, the fluorescent silicone film has the light emitting layer made of the fluorescent powders and has the light transmission layer made of the optical silicone.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method of manufacturing a fluorescent silicone film comprising of the following steps in the order named:
   A. mixing optical silicone and fluorescent powders so as to produce a mixture of the optical silicone and the fluorescent powders;
   B. adding liquid to the mixture;
   C. vacuuming and degassing the mixture with the liquid;
   D. feeding the mixture with the liquid into an accommodation cavity of a mold;
   E. placing the mold into a planetary centrifugal mixer so as to centrifuge the mixture with the liquid in the accommodation cavity of the mold;
   F. forming a fluorescent silicone film in the accommodation cavity; and
   G. solidifying and removing the fluorescent silicone film from the mold;
   wherein in the step of A, the optical silicone and the fluorescent powders are mixed at a ratio of 100:10 to 100:25;
   wherein in the step of C, the accommodation cavity is closed after feeding the mixture with the liquid; and
   wherein in the step of F, the fluorescent silicone film has a silicone layer and a fluorescent powder layer which are formed in the accommodation cavity in a chemical vapor deposition (CVD) manner.

2. The method as claimed in claim 1, wherein in the step of G, the mold is baked and is cooled, wherein the mold is fixed in a baking machine so as to be baked in a temperature of 70° C. for 45-90 minutes by the baking machine, and the mold is cooled in a room temperature so as to solidify the fluorescent silicone film in the accommodation cavity of the mold, thereafter the fluorescent silicone film is removed from the mold.

3. The method as claimed in claim 1, wherein the mold includes a base and a lid, and the base has an accommodation cavity configured to accommodate the mixture with the liquid.

4. The method as claimed in claim 1, wherein the accommodation cavity has a flat slot and a plurality of trapezoid trenches communicating with the flat slot.

5. The method as claimed in claim 1, wherein a positioning structure is defined on the base and the lid, and the positioning structure includes at least one fixing column extending upwardly from a top of the base, and the positioning structure also includes at least one connection orifice defined on the lid and configured to fit with the at least one fixing column.

6. A method of manufacturing a fluorescent silicone film comprising of the following steps in the order named:
   A. mixing optical silicone and fluorescent powders so as to produce a mixture of the optical silicone and the fluorescent powders;
   B. adding liquid to the mixture;
   C. feeding the mixture with the liquid into an accommodation cavity of a mold;

D. placing the mold into a planetary centrifugal mixer so as to centrifuge the mixture with the liquid in the accommodation cavity of the mold;

E. forming a fluorescent silicone film in the accommodation cavity; and

F. solidifying and removing the fluorescent silicone film from the mold;

wherein in the step of E, the fluorescent silicone film has a silicone layer and a fluorescent powder layer which are formed in the accommodation cavity in a chemical vapor deposition (CVD) manner;

wherein the mold includes a base and a lid, and the base has the accommodation cavity configured to accommodate the mixture with the liquid wherein the accommodation cavity of the base has a flat slot and a plurality of trapezoid trenches communicating with the flat slot; and wherein the fluorescent powder layer floats in the flat slot of the accommodation cavity, and the silicone layer is located under the fluorescent powder layer in the accommodation cavity.

7. The method as claimed in claim 6, wherein the fluorescent silicone film includes a light transmission layer and a light emitting layer, wherein the light emitting layer is made of the fluorescent powders, and the light transmission layer is made of the optical silicone and has multiple trapezoid protrusions arranged on a bottom thereof.

\* \* \* \* \*